(12) United States Patent
Takagi et al.

(10) Patent No.: US 8,604,883 B2
(45) Date of Patent: Dec. 10, 2013

(54) CLASS-C POWER AMPLIFIER

(75) Inventors: Kazutaka Takagi, Kawasaki (JP);
Naotaka Tomita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/267,116

(22) Filed: Oct. 6, 2011

(65) Prior Publication Data

US 2012/0218045 A1  Aug. 30, 2012

(30) Foreign Application Priority Data

Feb. 28, 2011  (JP) .................................. 2011-042665

(51) Int. Cl.
*H03F 3/04*  (2006.01)
(52) U.S. Cl.
USPC ............................. 330/302; 330/305; 330/277
(58) Field of Classification Search
USPC .................... 330/302, 305–307, 277, 286, 53
See application file for complete search history.

(56) References Cited

U.S. PATENT DOCUMENTS

| | | | |
|---|---|---|---|
| 7,741,907 B2 | 6/2010 | Takagi | |
| 8,008,976 B2 * | 8/2011 | Woo et al. | 330/302 |
| 2012/0105147 A1 * | 5/2012 | Harris et al. | 330/57 |

FOREIGN PATENT DOCUMENTS

| | | |
|---|---|---|
| JP | 2000-106510 A | 4/2000 |
| JP | 2008-263438 A | 10/2008 |
| JP | 2009-94805 | 4/2009 |
| JP | 2009-182906 A | 8/2009 |
| JP | 2011-35761 A | 2/2011 |
| JP | 2012-518373 A | 8/2012 |
| WO | WO 2011/007529 A1 | 1/2011 |

OTHER PUBLICATIONS

Peter Wright et al., "A Methodology for Realizing High Efficiency Class-J in a Linear and Broadband PA", IEEE Transactions on Microwave Theory and Techniques, vol. 57, No. 12, Dec. 2009, pp. 3196-3204.

Steve C. Cripps et al., "New PA Modes for a New PA Technology", IEEMTT-S Workshop (WSF), Jul. 2010, 20 Pages.

Office Action issued Dec. 4, 2012 in Japanese Patent Application No. 2011-042665 with English language translation.

U.S. Appl. No. 13/728,167, filed Dec. 27, 2012, Takagi.

* cited by examiner

*Primary Examiner* — Hieu Nguyen
(74) *Attorney, Agent, or Firm* — Oblon, Spivak, McClelland, Maier & Neustadt, L.L.P.

(57) ABSTRACT

According to one embodiment, a class-C power amplifier includes an amplifying element whose power supply voltage is expressed as Vdc and whose maximum current is expressed as Imax, a conduction angle $\theta o$ of the amplifying element being less than $\pi$(rad), and load impedance of a fundamental wave being expressed as $Z1=R1+j\cdot X1$ and load impedance of a 2nd harmonic being expressed as $Z2=R2+j\cdot X2$ which are observed from a dependent current source of an equivalent circuit of the amplifying element, wherein a relationship between variables X1 and R1 is set to $-R1<=X1<=R1$, variable R1 is set to $R1=Vdc/Imax\cdot\pi\cdot\{1-\cos(\theta o/2)\}/\{\theta o/2-\sin(\theta o)/2\}$, and variable X2/X1 is set to $X2/X1=-\{\theta o/2-\sin(\theta o)/2\}/\{\sin(\theta/2)-\sin(1.5\cdot\theta o)/3\}$, or each of the variables is set thereto so as to become equal substantially.

10 Claims, 10 Drawing Sheets

CLASS-C POWER AMPLIFIER

CROSS REFERENCE TO RELATED APPLICATIONS

This application is based upon and claims the benefit of priority from prior Japanese Patent Application No. P2011-042665 filed on Feb. 28, 2011, the entire contents of which are incorporated herein by reference.

FIELD

Embodiment described herein generally relate to a class-C power amplifier.

BACKGROUND

A power amplifier for radar applications which keeps output electric power in a pulse at a constant value and is often operated by maximum electric output power is often composed by a class-C power amplifier, in order to operate with a high degree of efficiency. However, in order to increase the efficiency of a class-C operation, load impedance for higher order harmonics must be short-circuited based on theory. Therefore, the degree of difficulty in achieving broader bandwidths is great.

A power amplifier for communication applications of which high linearity is required is often composed by a non-linear class-B power amplifier to such an extent that distortion can be compensated in linearizer. This is because the class-B power amplifier is operated with a degree of efficiency lower than a class-C power amplifier, but the class-B power amplifier can be operated with a degree of efficiency higher than a class-A power amplifier. However, in order to also increase the efficiency of a class-B operation, load impedance for higher order harmonics must be short-circuited based on theory. Therefore, the degree of difficulty in achieving the broader bandwidths was great.

On the other hand, the class-J/B operation received attention recently can achieve efficiency equivalent to the class-B operation over the broader bandwidths.

Although the class-B power amplifier can achieve the broader bandwidths, the class-B power amplifier is operated with a degree of efficiency lower than the class-C power amplifier. On the other hand, although the class-C power amplifier can be operated with a degree of efficiency higher than the class-B power amplifier, its bandwidth is narrow.

DETAILED DESCRIPTION

Hereinafter, embodiments will be described with reference to drawings.

A class-C power amplifier according to the present embodiment comprises an amplifying element whose power supply voltage is expressed as Vdc and whose maximum current is expressed as Imax, a conduction angle $\theta o$ of the amplifying element being less than $\pi$(rad), and load impedance of a fundamental wave being expressed as $Z1=R1+j \cdot X1$ and load impedance of a 2nd harmonic being expressed as $Z2=R2+j \cdot X2$ which are observed from a dependent current source of an equivalent circuit of the amplifying element, wherein a relationship between variables X1 and R1 is set to $-R1 \leq X1 \leq R1$, variable R1 is set to $R1=Vdc/Imax \cdot \pi \cdot \{1-\cos(\theta o/2)\}/\{\theta o/2 - \sin(\theta o)/2\}$, and variable X2/X1 is set to $X2/X1=-\{\theta o/2-\sin(\theta o)/2\}/\{\sin(\theta o/2)-\sin(1.5\cdot\theta o)/3\}$, or each of the variables is set thereto so as to become equal substantially.

Figure 1:
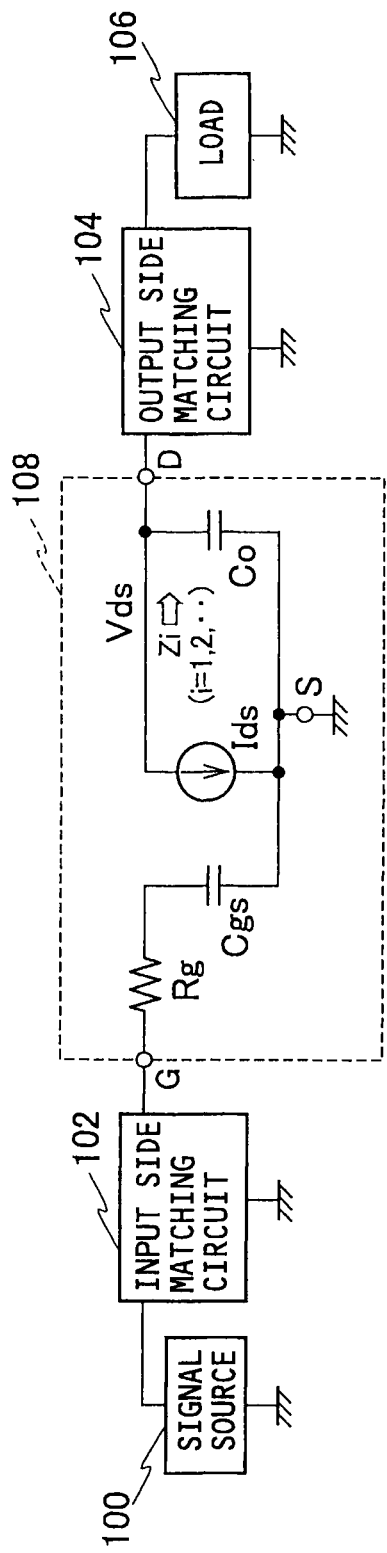
FIG. 1 is a diagram showing an example of an equivalent circuit simplified by omitting a bias circuit etc., in a class-C power amplifier according to an embodiment.

In the class-C power amplifier according to the embodiment, an example of an equivalent circuit simplified by omitting a bias circuit etc. is expressed as shown in FIG. 1.

Although not only a semiconductor but also a vacuum tube etc. may be sufficient as the amplifying element, it will explain a source common Field Effect Transistor (FET) 108 as the amplifying element, hereinafter.

As shown in FIG. 1, the equivalent circuit of the class-C power amplifier according to the embodiment includes: a gate resistance Rg and a capacitor Cgs between gate and source configured to be connected in series between a gate terminal electrode G and a source terminal electrodes S; a current source Ids and an output capacitance Co configured to be connected in parallel between the drain terminal electrode D and the source terminal electrode S; an input side matching circuit 102 configured to be connected to the gate terminal electrode G; and an output side matching circuit 104 configured to be connected to the drain terminal electrode D.

Furthermore, a signal source 100 is connected to the input side matching circuit 102, and a load 106 is connected to the output side matching circuit 104.

A circuit configuration of an equivalent circuit of a class-B operation according to a comparative example is also the same as that of the equivalent circuit of the class-C power amplifier according to the embodiment shown in FIG. 1. A difference between the class-C operation and the class-B operation is a difference in both conduction angles. A difference between the class-C operation and the class-B operation is a difference in both conduction angles.

The difference in the both conduction angles is caused by a difference in both gate biases.

According to a theory of the class-B operation whose conduction angle is $\theta o=\pi(rad)$, maximum electric output power $Po=Vdc\cdot Imax/4$ in linearity are obtained, where power supply voltage of DC component of voltage Vds between drain and source is expressed as Vdc, the maximum current of current Ids of a dependent current source is expressed as Imax, load impedance of a fundamental wave observed from the dependent current source is expressed by the following equation, $Z1=R1+j\cdot X1=2\cdot Vdc/Imax$, and load impedance for higher order harmonics is expressed by the following equation, $Zi=Ri+j\cdot Xi=0$ (where i=2, 3, ... ).

At this time, as for the DC component of the current Ids, the electronic power supply current is expressed by the following equation, $Idc=Imax/\pi$, power consumption is expressed by the following equation, $Pdc=Vdc\cdot Imax/\pi$, and drain efficiency (abbreviated as efficiency, hereinafter) is expressed by the following equation, $\eta d=Po/Pdc=\pi/4=78.5\%$.

Figure 2:
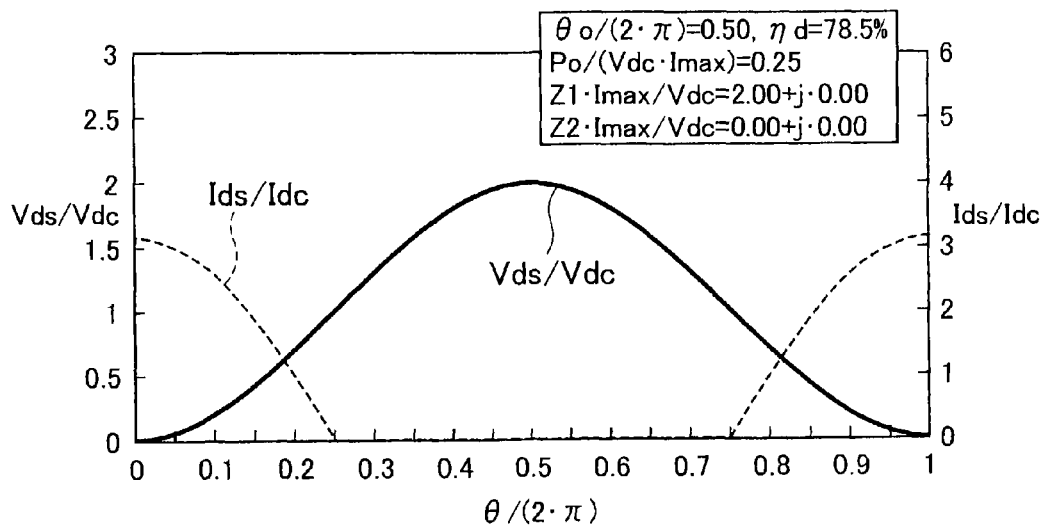
FIG. 2 is a diagram showing an example of waveforms of Vds/Vdc and Ids/Idc, in a class-B operation according to a comparative example.

An example of waveforms of Vds/Vdc and Ids/Idc of the class-B operation according to the comparative example is expressed as shown in FIG. 2. That is, as shown in FIG. 2, in waveforms where a horizontal axis indicates phase $\theta/(2\cdot\pi)$ standardized in one cycle, and a vertical axis indicates Ids/Idc of Ids standardized by Idc and Vds/Vdc of Vds standardized by Vdc, Ids contains no odd-number order harmonics component, and a 2nd harmonic component I2 for a fundamental wave component I1 of Ids is I2/I1=0.42. Furthermore, Vds contains no harmonic component.

However, in an actual output side matching circuit, even if not less than the 3rd harmonic is ignored, equations $Z1=2\cdot Vdc/Imax$ and $Z2=0$ are unrealizable over the broader bandwidths.

Figure 3:
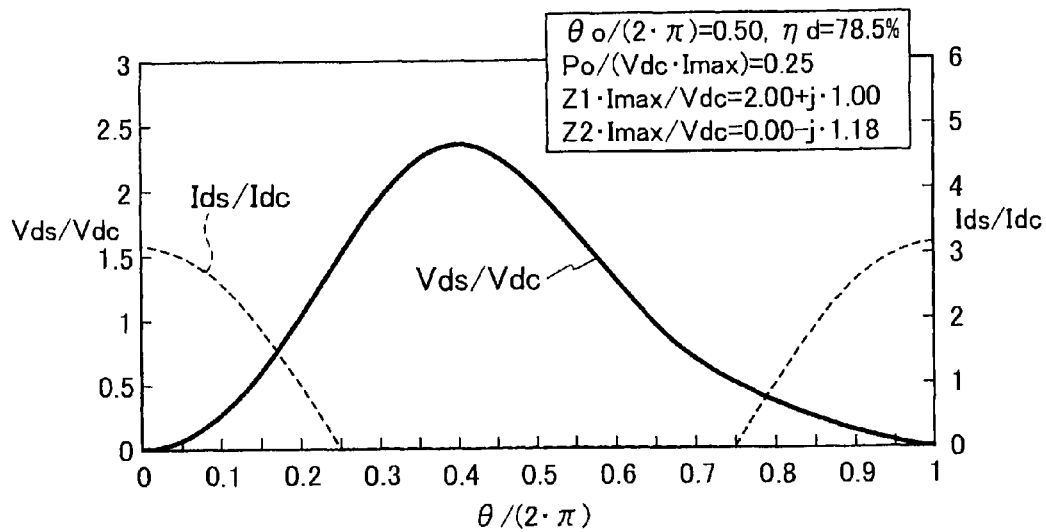
FIG. 3 is a diagram showing an example of waveforms of Vds/Vdc and Ids/Idc, in one example of a class-J/B operation according to the comparative example.
Figure 4:
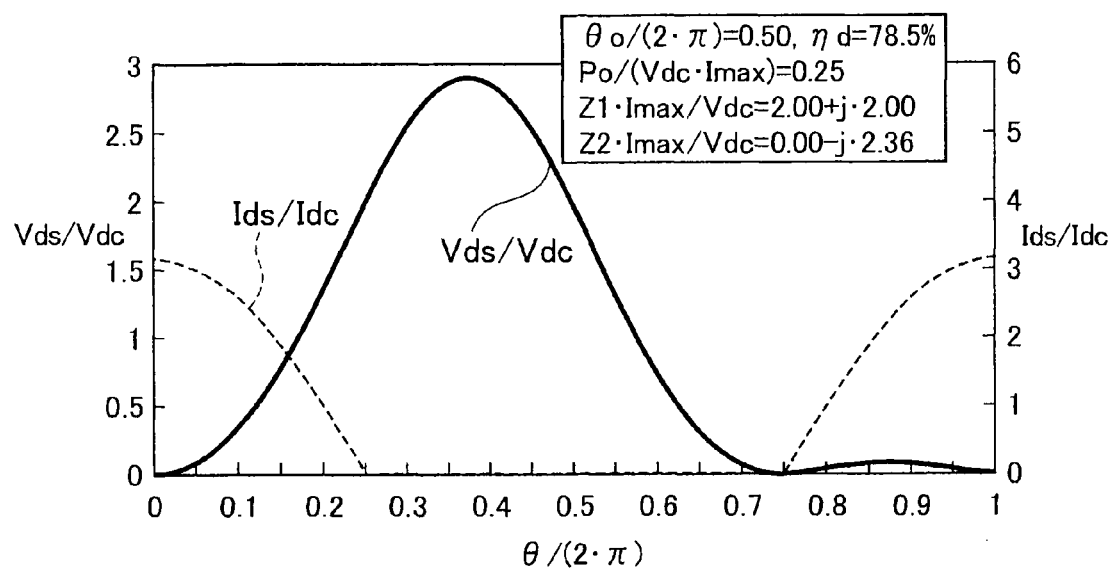
FIG. 4 is a diagram showing an example of waveforms of Vds/Vdc and Ids/Idc, in a class-J operation according to the comparative example.

On the other hand, an example of waveforms of Vds/Vdc and Ids/Idc of one example of a class-J/B operation according to the comparative example is expressed as shown in FIG. 3, and an example of waveforms of Vds/Vdc and Ids/Idc of a class-J operation according to the comparative example is expressed as shown in FIG. 4.

If $X2=-3\cdot\pi/8\cdot X1=-1.18\cdot X1$ is satisfied even when equation $X1=0.5\cdot R1$ or $X1=R1$ is realized, for example, without R1 and R2 being changed for the class-B operation according to the comparative example shown in FIG. 2, neither nd nor Po will be changed as shown in FIG. 3 or FIG. 4. Such condition is satisfied in $-R1<=X1<=R1$. In addition, although values of Ids of FIG. 3 and FIG. 4 are the same as that of FIG. 2, values of a fundamental wave component V1 of Vds of FIG. 3 and FIG. 4 are $1.12\angle 0.15\cdot\pi(rad)$-fold and $1.41\angle 0.25\cdot\pi(rad)$-fold as compared with V1 of FIG. 2, respectively, and values of a 2nd harmonic component V2 of Vds of FIG. 3 and FIG. 4 are $0.25\angle 0.5\cdot\pi(rad)$-fold and $0.5\angle 0.5\cdot\pi(rad)$-fold as compared with V1 of FIG. 2, respectively.

As mentioned above, in the output side matching circuit, the relationship between variables X1 and R1 is set to $-R1<=X1<=R1$, variable R1 is set into $R1=2\cdot Vdc/Imax$, and variable X2/X1 is set to $X2/X1=-3\cdot\pi/8=-1.18$, or each of the variables is set close thereto, and thereby $\eta d$ and Po same as the class-B operation are achievable over the broader bandwidths.

However, since the class-J/B operation is the case where the conduction angle $\theta o$ is equal to $\pi(rad)$, the class-J/B operation is not applicable to the class-C operation whose conduction angle $\theta o$ is less than $\pi(rad)$.

In the class-C operation whose conduction angle $\theta o$ is less than $\pi(rad)$, the load impedance of the fundamental wave and the load impedance of the 2nd harmonic are applied as a function of $\theta o$, and thereby providing a power amplifier having a high degree of efficiency over the broad.

The DC component of Ids is expressed by the following equation, $$Idc=Imax\cdot\{\sin(\theta o/2)-\theta o/2\cdot\cos(\theta o/2)\}/[\pi\cdot\{1-\cos(\theta o/2)\}],$$

and is expressed by $Idc=Imax/\pi$ at the time of $\theta o=\pi$, and is expressed by $Idc\rightarrow Imax\cdot\theta o/(3\cdot\pi)$ at the time of $\theta o\rightarrow 0$.

The fundamental wave component of Ids is expressed by the following equation, $$I1=Imax\cdot\{\theta o/2-\sin(\theta o)/2\}/[\pi\cdot\{1-\cos(\theta o/2)\}],$$

and is expressed by $I1=Imax/2$ at the time of $\theta o=\pi$, and is expressed by $I1\rightarrow Imax\cdot\theta o\cdot 2/(3\cdot\pi)$ at the time of $\theta o\rightarrow 0$.

The 2nd harmonic component of Ids is expressed by the following equation, $$I2=Imax\cdot\{\sin(\theta o/2)/2-\sin(1.5\cdot\theta o)/6\}/[\pi\cdot\{1-\cos(\theta o/2)\}],$$

and is expressed by $I2=Imax\cdot 2/(3\cdot\pi)$ at the time of $\theta o=\pi$, and is expressed by $I2\rightarrow Imax\cdot\theta o\cdot 2/(3\cdot\pi)$ at the time of $\theta o\rightarrow 0$.

A root mean square value of Ids is expressed by the following equation, $$Irms=Imax\cdot[\theta o/2-3\cdot\cos(\theta o/2)\cdot\sin(\theta o/2)+\theta o\cdot\{\cos(\theta o/2)\}2]^{0.5}/[(2\cdot\pi)^{0.5}\{1-\cos(\theta o/2)\}],$$

and is expressed by $Irms=Imax/2$ at the time of $\theta o=\pi$, and is expressed by $Irms\rightarrow 0.5\cdot Imax-(\theta o/\pi)^{0.5}$ at the time of $\theta o\rightarrow 0$.

Vds is expressed by the following equation, $$Vds=Vdc-[I1\cdot\{R1\cdot\cos(\theta)-X1\cdot\sin(\theta)\}+I2\cdot\{R2\cdot\cos(2\cdot\theta)-X2\cdot\sin(2\cdot\theta)\}],$$

and in the case of standardizing by Vdc, substituting above-mentioned I1 and I2, and assuming R2=0, the following equation is satisfied.

$$Vds/Vdc = 1 - [\{\theta o/2 - \sin(\theta o)/2\} \cdot \{R1 \cdot \cos(\theta) - X1 \cdot \sin(\theta)\} - \{\sin(\theta o/2)/2 - \sin(1.5 \cdot \theta o)/6\} \cdot X2 \cdot \sin(2 \cdot \theta)] \cdot Imax/Vdc/[\pi \cdot \{1 - \cos(\theta o/2)\}] \quad (1)$$

In this case, Vds/Vdc is expressed by the following equation, $$Vds/Vdc = \{1 - \cos(\theta)\} \cdot \{1\beta \cdot \sin(\theta)\},$$

and if $-1 <= \beta <= +1$ is satisfied, Vds is expressed by Vds=0 once or twice per cycle and changes over a range of Vds>=0.

When the above is arranged using the following formula of the trigonometric function $\sin(\theta) \cdot \cos(\theta) = \sin(2 \cdot \theta)/2$, the following equation is satisfied.

$$Vds/Vdc = 1 - \cos(\theta) - \beta \cdot \sin(\theta) + \beta/2 \cdot \sin(2 \cdot \theta) \quad (2)$$

If the equation (1) is compared with the equation (2), the following equations (3) to (5) are satisfied.

$$1 = \{\theta o/2 - \sin(\theta o)/2\} \cdot R1 \cdot Imax/Vdc/[\pi \cdot \{1 - \cos(\theta o/2)\}] \quad (3)$$

$$\beta = -\{\theta o/2 - \sin(\theta o)/2\} \cdot X1 \cdot Imax/Vdc/[\pi \cdot \{1 - \cos(\theta o/2)\}] \quad (4)$$

$$\beta = \{\sin(\theta o) - \sin(1.5 \cdot \theta o)/3\} \cdot X2 \cdot Imax/Vdc/[\pi \{1 - \cos(\theta o/2)\}] \quad (5)$$

The following equation is given by the equation (3).

$$R1 = Vdc/Imax \cdot \pi \cdot \{1 - \cos(\theta o/2)\} / \{\theta o/2 - \sin(\theta o)/2\}$$

The following equation is given by the equation (3) and the equation (4).

$$-R1 <= X1 <= R1$$

The following equation is given by the equation (4) and the equation (5).

$$X2/X1 = -\{\theta o/2 - \sin(\theta o)/2\} / \{\sin(\theta o/2) - \sin(1.5 \cdot \theta o)/3\}.$$

The following equations, $R1 = 2 \cdot Vdc/Imax$ and $X2/X1 = -3 \cdot \pi/8 = -1.18$, are satisfied at the time of $\theta o = \pi$, and the following equations, $R1 \rightarrow 3 \cdot \pi/(2 \cdot \theta o) \cdot Vdc/Imax$ and $X2/X1 = -\frac{1}{2}$, are satisfied at the time of $\theta o \rightarrow 0$.

On the other hand, the power consumption Pdc of DC is expressed by the following equation, $$Pdc = Vdc \cdot Idc = Vdc \cdot Imax \cdot \{\sin(\theta o/2) \cdot \theta o/2 \cdot \cos(\theta o/2)\} / [\pi \cdot \{1 - \cos(\theta o/2)\}],$$

and the following equation, $Pdc = Vdc \cdot Imax/\pi$, is satisfied at the time of $\theta o = \pi$, and the following equation, $Pdc \rightarrow Vdc \cdot Imax \cdot \theta o/(3 \cdot \pi)$, is satisfied at the time of $\theta o \rightarrow 0$.

Maximum electric output power Po of the fundamental wave is expressed by the following equation, $$Po = 0.5 \cdot R1 \cdot I1^2 = 0.25 \cdot Vdc \cdot Imax \cdot \{\theta o - \sin(\theta o)\} / [\pi \cdot \{1 - \cos(\theta o/2)\}],$$

and the following equation, $Po = Vdc \cdot Imax/4$, is satisfied at the time of $\theta o = \pi$, and the following equation, $Po \rightarrow Vdc \cdot Imax \cdot \theta o/(3 \cdot \pi)$, is satisfied at the time of $\theta o \rightarrow 0$.

Drain efficiency $\eta d$ is expressed by the following equation, $$\eta d = Po/Pdc = 0.25 \cdot \{\theta o - \sin(\theta o)\} / \{\sin(\theta o/2) - \theta o/2 \cdot \cos(\theta o/2)\},$$

and the following equation, $\eta d = \pi/4$, is satisfied at the time of $\theta o = \pi$, and the following equation, $\eta d = 1$, is satisfied at the time of $\theta o \rightarrow 0$.

In the case of on resistance Ron of FET is not $0\Omega$, power loss Pron by the Ron is expressed by the following equation, $$Pron = Ron \cdot Irms^2 = Ron \cdot Imax^2 \cdot [\theta o/2 - 3 \cdot \cos(\theta o/2) \cdot \sin(\theta o/2) + \theta o \cdot \{\cos(\theta o/2)\}^2] / [2 \cdot \pi \cdot \{1 - \cos(\theta o/2)\}^2],$$

and the following equation, $Pron = Ron \cdot Imax^2/4$, is satisfied at the time of $\theta o = \pi$, and the following equation, $Pron \rightarrow Ron \cdot Imax^2 \cdot \theta o/(4 \cdot \pi)$, is satisfied at the time of $\theta \rightarrow 0$.

A ratio Lo of Pron to Po is expressed by the following equation, $$Lo = Pron/Po = Ron \cdot Imax/Vdc \cdot [\theta o/2 - 3 \cdot \cos(\theta o/2) \cdot \sin(\theta o/2) + \theta o \cdot \{\cos(\theta o/2)\}^2] / [\{\theta o/2 - \sin(\theta o)/2\} \cdot \{1 - \cos(\theta o/2)\}],$$

and the following equation, $Lo = Ron \cdot Imax/Vdc$, is satisfied at the time of $\theta o = \pi$, and the following equation, $Lo \rightarrow Ron \cdot Imax/Vdc \cdot \frac{4}{5}$, is satisfied at the time of $\theta o \rightarrow 0$.

The above relation will be explained referring graphic charts.

Figure 5:
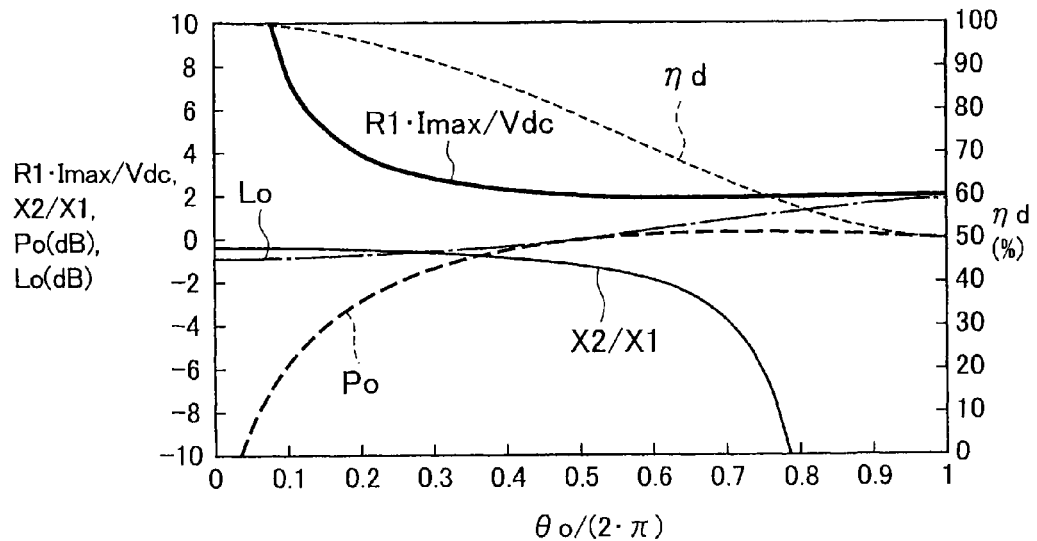
FIG. 5 is a diagram showing characteristics of each parameter $R1 \cdot Imax/Vdc$, $X2/X1$, Po, Lo, and $\eta d$ for a conduction angle $\theta o/(2 \cdot \pi)$, in the class-C power amplifier according to the embodiment.

FIG. 5 shows characteristics of each parameter $R1 \cdot Imax/Vdc$, $X2/X1$, Po, Lo and $\eta d$ for the conduction angle $\theta o/(2 \cdot \pi)$, in the class-C power amplifier according to the embodiment.

FIG. 5 shows each parameter $R1 \cdot Imax/Vdc$, $X2/X1$, Po, Lo and $\eta d$ at the time that the conduction angle $\theta o/(2 \cdot \pi)$ is changed from 0 to 1. If assumed as $X1 = X2 = 0$, $R1 \cdot Imax/Vdc$, Po, Lo and $\eta d$ are the same as that of the conventional class-A operation to class-C operation, and $\theta o/(2 \cdot \pi) = 1$ is corresponding to the class-A operation, $0.5 < \theta o/(2 \cdot \pi) < 1$ is corresponding to the class-AB operation, $\theta o/(2 \cdot \pi) = 0.5$ is corresponding to the class-B operation, and $0 < \theta o/(2 \cdot \pi) < 0.5$ is corresponding to the class-C operation. Although $\eta d = 78.5\%$ is realized in $\theta o/(2 \cdot \pi) = 0.5$ of the class-B operation, if assumed as $\theta o/(2 \cdot \pi) = 0.3$ in the class-C operation, for example, $\eta d = 91.5\%$ is realized, and a high degree of efficiency no less than 13% is achieved as compared with the class-B operation. Also, if compared with a class-B operation, $R1 \cdot Imax/Vdc = 2.77$ is 1.39-fold, $X1 = R2 = X2 = 0$ is the same, $Lo = Pron/Po1$ is $-0.61$ dB and is improved a little, and the reduction of Po is only 1.42 dB. Although $X2/X1 = -3 \cdot \pi/8 = -1.18$ is realized in the case of $\theta o/(2 \cdot \pi) = 0.5$ of the class-J/B operation, $X2/X1 = -0.661$ is realized in the case of $\theta o/(2 \cdot \pi) = 0.3$, for example, of the embodiment.

Figure 6:
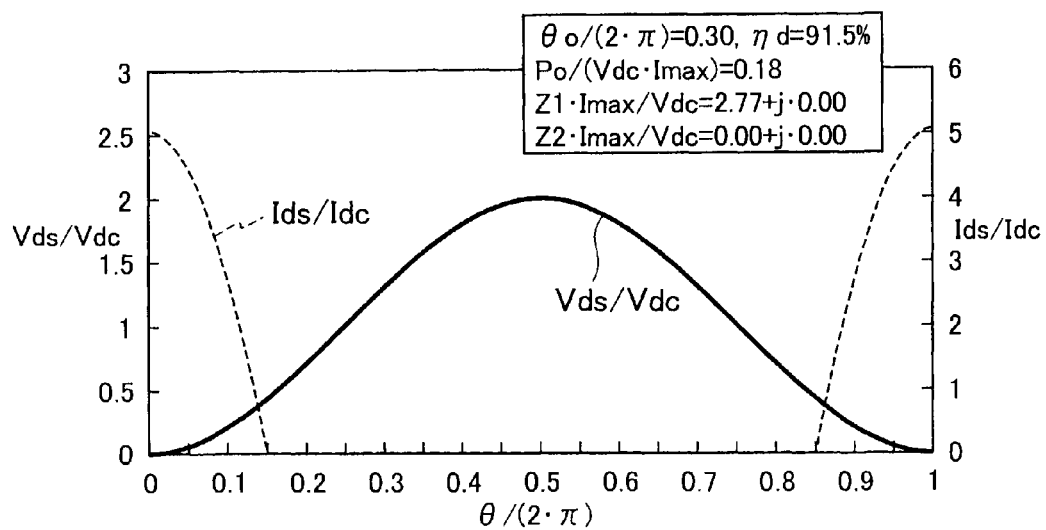
FIG. 6 is a diagram showing an example of waveforms of Vds/Vdc and Ids/Idc, in a class-C operation according to the comparative example.

An example of waveforms of Vds/Vdc and Ids/Idc of the class-C operation according to the comparative example is expressed as shown in FIG. 6.

As clearly from Ids/Idc shown in FIG. 6, the fundamental wave component I1 of Ids decreases by 0.72-fold as compared with I1 of the class-B operation in FIG. 2, and 2nd harmonic component I2 of Ids increases by 0.55-fold as compared with I1 in FIG. 2. As clearly from Vds/Vdc shown in FIG. 6, the fundamental wave component V1 of Vds is the same as that of V1 in FIG. 2, and Vds contains no harmonic component.

Figure 7:
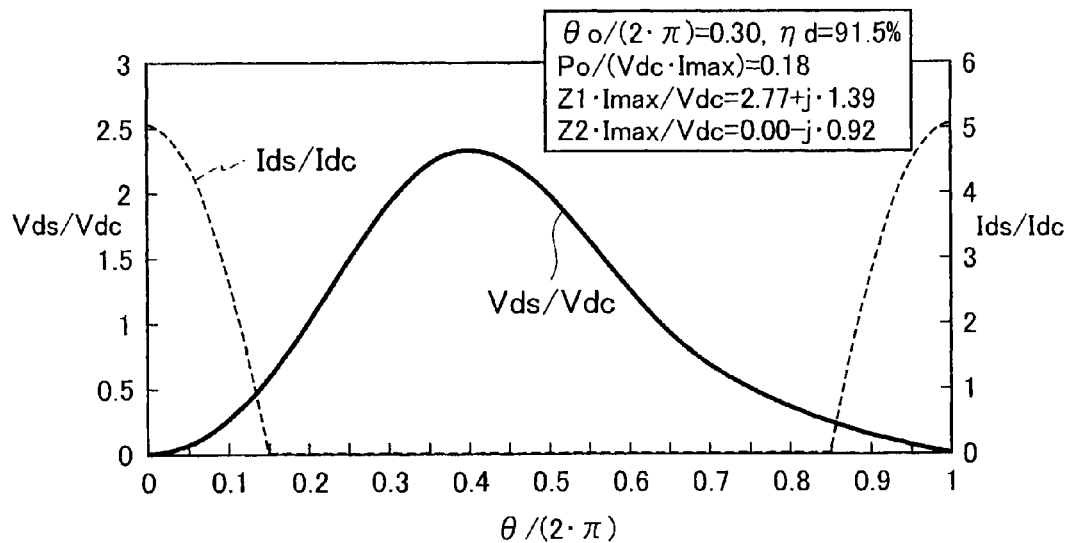
FIG. 7 is a diagram showing an example of waveforms of Vds/Vdc and Ids/Idc, in the class-C power amplifier according to the embodiment.
Figure 8:
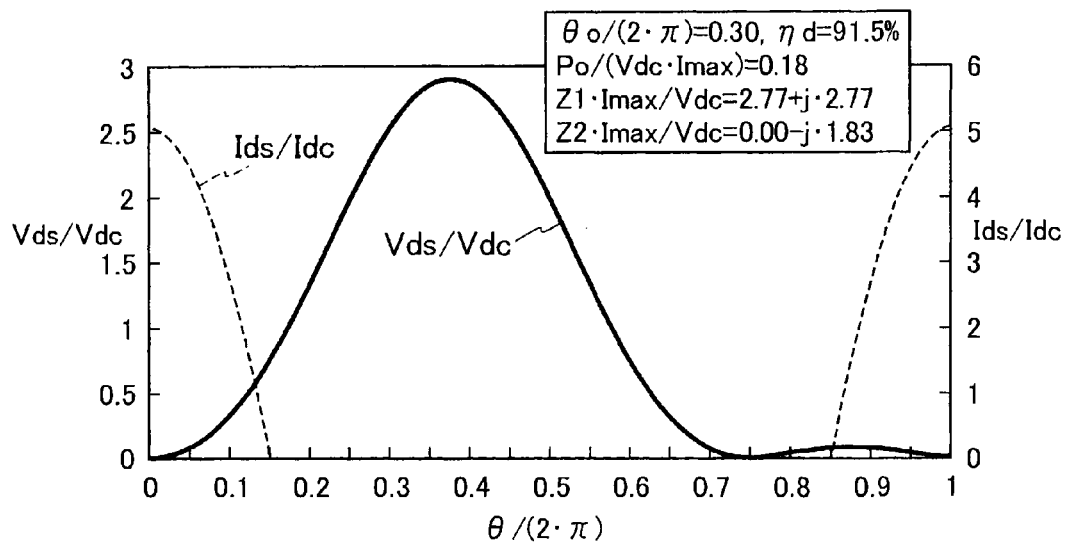
FIG. 8 is a diagram showing an example of alternative waveforms of Vds/Vdc and Ids/Idc, in the class-C power amplifier according to the embodiment.

On the other hand, if $X2 = -0.661 \cdot X1$ is satisfied even when equation $X1 = 0.5 \cdot R1$ or $X1 = R1$ is realized, for example, without R1 and R2 being changed, neither $\eta d$ nor Po will be changed as compared with FIG. 6, as shown in FIG. 7 or FIG. 8. Here, FIG. 7 shows an example of waveforms of Vds/Vdc and Ids/Idc in the class-C power amplifier according to the embodiment, and FIG. 8 shows an example of alternative waveforms of Vds/Vdc and Ids/Idc in the class-C power amplifier according to the embodiment.

In addition, although Ids of FIG. 7 and FIG. 8 is the same as that of FIG. 6, the fundamental wave components V1 of Vds in FIG. 7 and FIG. 8 become $1.12 \angle 0.15 \cdot \pi(\text{rad})$-fold and $1.41 \angle 0.25 \cdot \pi(\text{rad})$-fold as compared with V1 in FIG. 6, respectively, and the 2nd harmonic component V2 in FIG. 7 and FIG. 8 become $0.25 \angle -0.5 \cdot \pi(\text{rad})$-fold and $0.5 \angle -0.5 \cdot \pi(\text{rad})$ as compared with V1 in FIG. 6, respectively. The above-mentioned relations are the same as that of FIG. 2 to FIG. 4.

Figure 9:
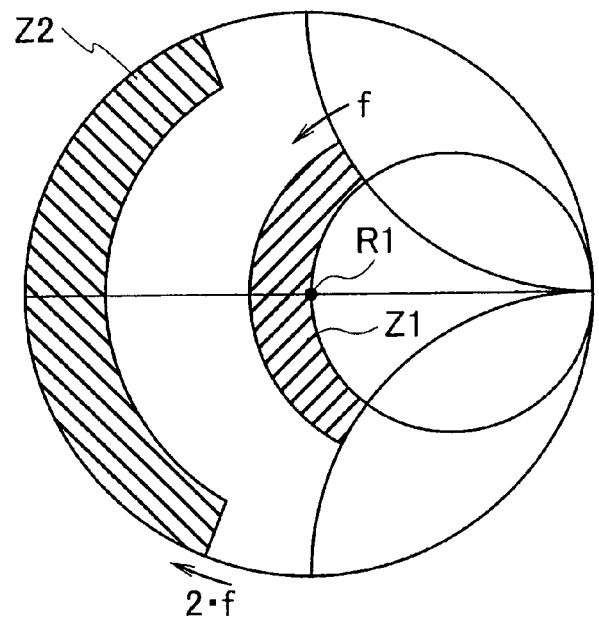
FIG. 9 is a diagram showing an example of a range of load impedances (Smith chart) of a fundamental wave and a 2nd harmonic, in the class-C power amplifier according to the embodiment.

An example of a range of load impedances (Smith chart) of the fundamental wave and the 2nd harmonic in the class-C power amplifier according to the embodiment is expressed as shown in FIG. 9.

In the actual output side matching circuit 104, although achieving R2=0 is difficult over the broader bandwidths, since it can keep Po and $\eta d$ at high values as R2 is close to 0, it is applied as $R2 < \frac{1}{3} \cdot R1$. In FIG. 9 shows a range of load impedances (Smith chart) of a fundamental wave f and a 2nd harmonic 2·f when R2 is further set to small (that is, R2 is applied as R2<⅙·R1), in order to achieve a high degree of efficiency. If Z1=R1+j·X1 and Z2=R2+j·X2 in frequency band are applied into the range in FIG. 9, the output side matching circuit 104 can be designed so that X2 may be close to −0.661·X1.

Figure 10:
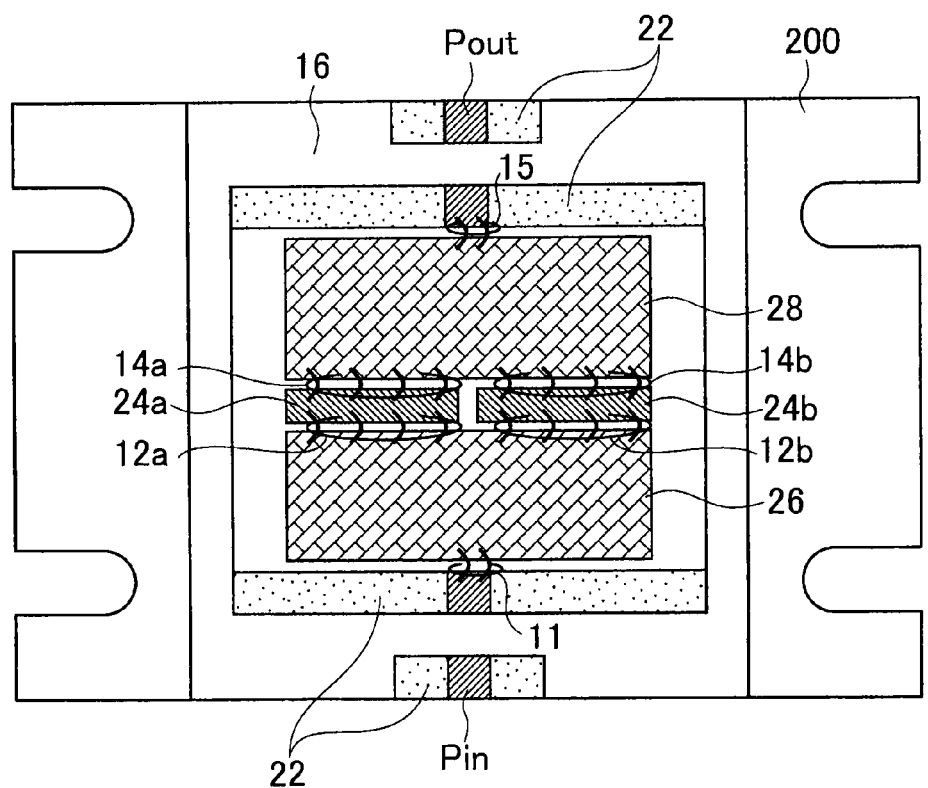
FIG. 10 is a schematic planar pattern configuration diagram showing an example of overview of an inside of housing, in the class-C power amplifier according to the embodiment.

In the class-C power amplifier according to the embodiment, a schematic planar pattern configuration showing an example of overview of an inside of housing 200 is expressed as shown in FIG. 10.

As shown in FIG. 10, on the housing 200, the class-C power amplifier according to the embodiment includes: a ceramic wall 16 configured to be disposed between an input terminal Pin and an output terminal Pout; semiconductor devices 24a and 24b configured to be disposed inside the ceramic wall 16; and an input side matching circuit substrate 26 and an output side matching circuit substrate 28 configured to be disposed to adjoin to the semiconductor devices 24a and 24b, respectively. An input side matching circuit 102 and an output side matching circuit 104 are disposed on the input side matching circuit substrate 26 and the output side matching circuit substrate 28, respectively. In this case, the input side matching circuit 102 and the output side matching circuit 104 are composed by applying a distributed transmission line electrical circuit or a lumped circuit (not shown), etc.

The bonding wire 11 connects between the input terminal Pin and the input side matching circuit substrate 26, the respective bonding wires 12a and 12b connect between the input side matching circuit substrate 26 and the respective semiconductor devices 24a and 24b, the respective bonding wires 14a and 14b connect between the output side matching circuit substrate 28 and the respective semiconductor devices 24a and 24b, and the bonding wire 15 connects between the output side matching circuit substrate 28 and the output terminal Pout. In addition, the input terminal Pin and the output terminal Pout are composed of striplines disposed on insulating layers 22.

Figure 11:
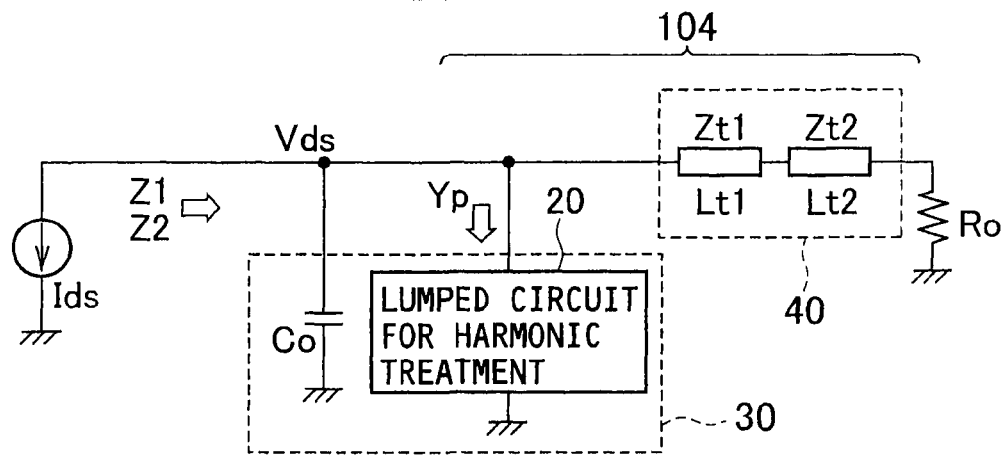
FIG. 11 is a schematic circuit configuration diagram for explaining one embodiment of an output side matching circuit, in the class-C power amplifier according to the embodiment.

The output side matching circuit 104 may be composed of a distributed transmission line electrical circuit, or a part of the output side matching circuit 104 may be composed of a lumped circuit for harmonic treatment 20, for example, in order to be built in the housing 200 shown in FIG. 10, as shown in FIG. 11.

As shown in FIG. 11, in the class-C power amplifier according to the embodiment, the output side matching circuit 104 includes a lumped circuit for harmonic treatment 20 and an impedance converting circuit 40. Here, although the lumped circuit for harmonic treatment 20 will be described later, the impedance converting circuit 40 is expressed by a distributed transmission line whose characteristic impedance and length are composed by two stages of Zt1 and Lt1=wavelength/4, and Zt2 and Lt2=wavelength/4.

The lumped circuit for harmonic treatment 20 not only short-circuits the 2nd harmonic of a center frequency fo, but also may achieve the broader bandwidths as a circuit for resonating in parallel with output capacitance Co in fo, for example. Then, the impedance converting circuit 40 performs impedance conversion of R1 to Ro of load. A short circuit is realized by a·ωo and c·ωo, and an open circuit is realized by DC, b·ωo and d·ωo, where the parallel circuit which connects the lumped circuit for harmonic treatment 20 with the output capacitance Co in parallel is expressed as a reactance circuit 30, its admittance is expressed as Yp, the angular frequency of fo is expressed as ωo=2·π·fo, b≈1, c≈2, and 0<a<b<c<d, and the following equation is satisfied.

$$Yp(s) = Hp \cdot \frac{s \cdot \{s^2 + (b \cdot \omega o)^2\} \cdot \{s^2 + (d \cdot \omega o)^2\}}{\{s^2 + (a \cdot \omega o)^2\} \cdot \{s^2 + (c \cdot \omega o)^2\}}$$

Figure 12:
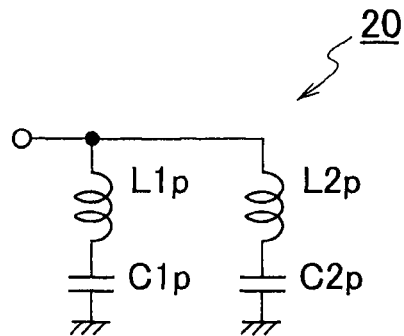
FIG. 12 is a schematic circuit configuration diagram for explaining one embodiment of a lumped circuit for harmonic treatment, in the class-C power amplifier according to the embodiment.
Figure 13:
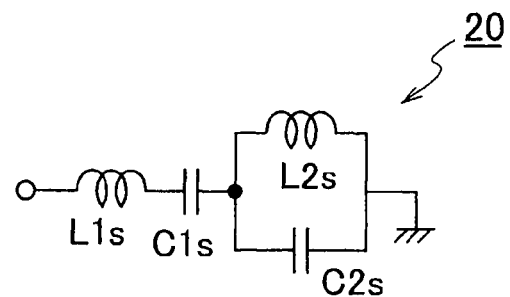
FIG. 13 is a schematic circuit configuration diagram for explaining another embodiment of the lumped circuit for harmonic treatment, in the class-C power amplifier according to the embodiment.
Figure 14:
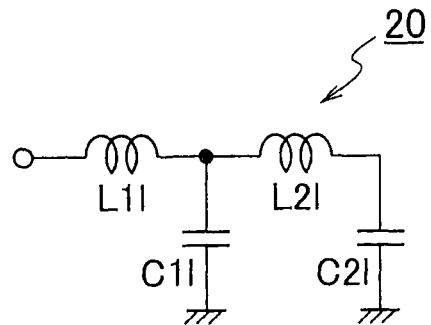
FIG. 14 is a schematic circuit configuration diagram for explaining another embodiment of the lumped circuit for harmonic treatment, in the class-C power amplifier according to the embodiment.

The above-mentioned Yp is achievable in the following three kinds of circuits. That is, in the class-C power amplifier according to the embodiment, schematic circuit configurations for explaining one embodiment of the lumped circuit for harmonic treatment 20 can be expressed as shown in FIG. 12 to FIG. 14.

First of all, in the following equation, $$Yp(s) = s \cdot Hp + Yp1(s)$$

which performed partial fraction expansion of Yp(s), it is applied as Hp=Co. If the partial fraction expansion of Yp1(s) is performed, the following equation is satisfied.

$$Yp1(s) = \frac{1}{s \cdot L1p + 1/(s \cdot C1p)} + \frac{1}{s \cdot L2p + 1/(s \cdot C2p)}$$

$$L1p = (c^2 - a^2)/\{Co \cdot \omega o^2 \cdot (b^2 - a^2) \cdot (d^2 - a^2)\}$$

$$C1p = Co \cdot (b^2 - a^2) \cdot (d^2 - a^2)/\{(c^2 - a^2) \cdot a^2\}$$

$$L2p = (c^2 - a^2)/\{Co \cdot \omega o^2 \cdot (c^2 - b^2) \cdot (d^2 - c^2)\}$$

$$C2p = Co \cdot (c^2 - b^2) \cdot (d^2 - c^2)/\{(c^2 - a^2) \cdot c^2\}$$

That is, as shown in FIG. 12, the reactance circuit 30, composed of a parallel circuit of the lumped circuit for harmonic treatment 20 and the output capacitance Co, is composed of a parallel circuit including a first series circuit composed of an inductor L1p and a capacitor C1p, and a second series circuit composed of an inductor L2p and a capacitor C2p.

Next, if partial fraction expansion of Zp1(s)=1/Yp1(s) is performed, the following equation is satisfied.

$$Zp1(s) = s \cdot L1s + \frac{1}{s \cdot C1s} + \frac{1}{s \cdot C2s + 1/(s \cdot L2s)}$$

$$K1 = \{(b^2 - a^2) \cdot (d^2 - a^2) + (c^2 - b^2) \cdot (d^2 - c^2)\}/(c^2 - a^2)$$

$$K2 = \{c^2 \cdot (b^2 - a^2) \cdot (d^2 - a^2) + a^2 \cdot (c^2 - b^2) \cdot (d^2 - c^2)\}/(c^2 - a^2)K1$$

$$L1s = 1/(Co \cdot \omega o^2 \cdot K1)$$

$$C1s = Co \cdot K1 \cdot K2/(a \cdot c)^2$$

$$L2s = 1/(C2 \cdot K2 \cdot \omega o^2)$$

$$C2s = Co \cdot K1 \cdot K2/\{(K2 - a^2) \cdot (c^2 - K2)\}$$

That is, as shown in FIG. 13, the lumped circuit for harmonic treatment 20 is composed of a series circuit including a series circuit composed of an inductor L1s and a capacitor C1s, and a parallel circuit composed of an inductor L2s and a capacitor C2s.

Finally, if continued-fraction expansion of Zp1(s) is performed, the following equation is satisfied.

$$Zp1(s) = s \cdot L1l + \frac{1}{s \cdot C1l + \frac{1}{s \cdot L2l + 1/(s \cdot C2l)}}$$

$$L1l = 1/(Co \cdot \omega o^2 \cdot K1)$$

$$C1l = Co \cdot K1/(a^2 + c^2 - K2)$$

-continued $$L2l = L1l \cdot (a^2 + c^2 - K2)/\{K2 - a^2 \cdot c^2/(a^2 + c^2 - K2)\}$$

$$C2l = Co \cdot K1 \cdot \{K2 - a^2 \cdot c^2/(a^2 + c^2 - K2)\}/(a^2 \cdot c^2)$$

That is, as shown in FIG. 14, the lumped circuit for harmonic treatment 20 is composed of a ladder type circuit including a series inductor L1$l$, a parallel capacitor C1$l$, a series inductor L2$l$, and a parallel capacitor C2$l$.

Although frequency characteristics of the three kinds of the circuits are the same, when the capacitor C and the inductor L are fabricated from a low-loss chip capacitor and a bonding wire in the housing 200 shown in FIG. 10, the circuit configuration of FIG. 12 needs to apply three kinds of bonding to drain electrode pads of FETs 24a and 24b, and the circuit configuration of FIG. 13 needs to apply a chip capacitor into two stories high. On the other hand, the circuit configuration of FIG. 14 is the easiest to mount.

Figure 15:
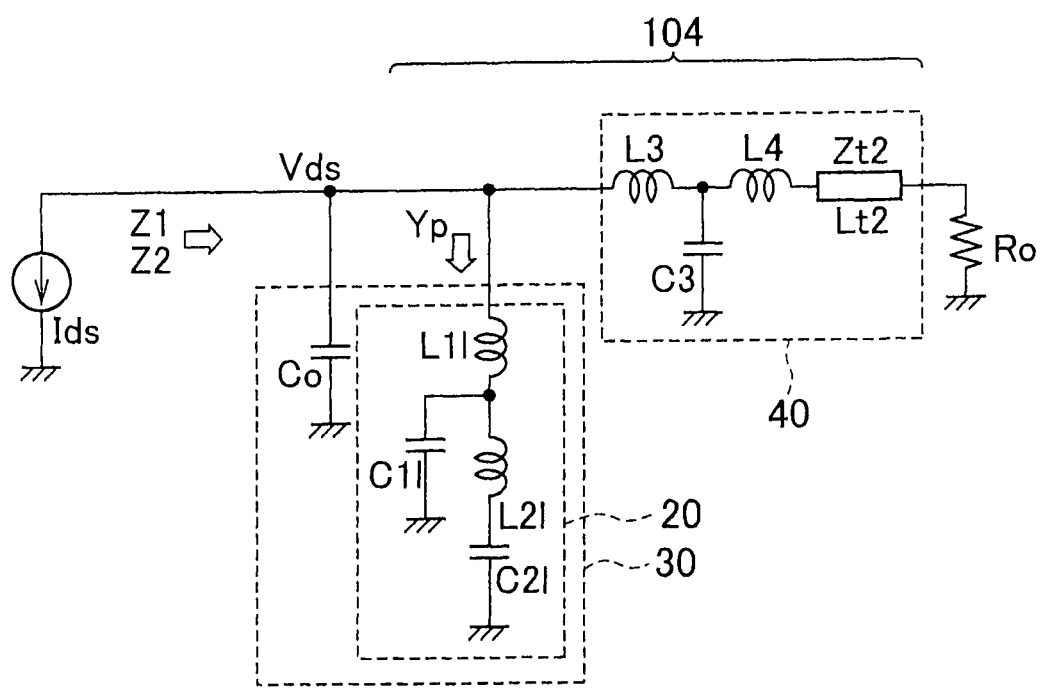
FIG. 15 is a schematic circuit configuration diagram for explaining another embodiment of the output side matching circuit, in the class-C power amplifier according to the embodiment.

In the class-C power amplifier according to the embodiment, a schematic circuit configuration for explaining an embodiment of the output side matching circuit 104 to which the lumped circuit for harmonic treatment 20 shown in FIG. 14 is applied is expressed as shown in FIG. 15. In FIG. 15, the lumped circuit for harmonic treatment 20 is composed of a ladder type circuit including a series inductor L1$l$, a parallel capacitor C1$l$, a series inductor L2$l$, and a parallel capacitor C2$l$, as well as FIG. 14.

Furthermore, since the impedance of the high power FET 108 which connects a plenty of cells in parallel is low, characteristic impedance Zt1 of the distributed transmission line at the side of FET is low, and the line width of the distributed transmission line on the alumina substrate whose relative dielectric constant is about 10 becomes wider than the width of the FET chip, in the impedance converting circuit 40 in FIG. 11. On the other hand, since the substrate having a high relative dielectric constant is easy to be broken, its degree of difficulty for mounting the substrate having a large area is great. Accordingly, the distributed transmission line of Zt1 is displaced to a lumped circuit including an inductor L3, a capacitor C3 and an inductor L4, as shown in FIG. 15.

Figure 16:
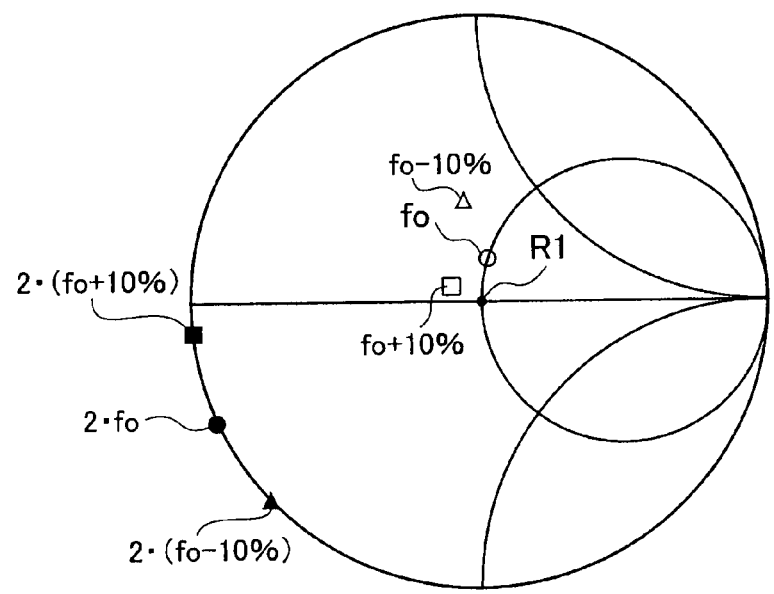
FIG. 16 is a diagram showing an example of load impedances (Smith chart) of a fundamental wave and a 2nd harmonic, in the class-C power amplifier according to the embodiment.

In the class-C power amplifier according to the embodiment, an example of load impedances (Smith chart) of the fundamental wave and the 2nd harmonic is expressed, as shown in FIG. 16.

Although characteristics are effective if frequency a·fo which is short-circuited is low, the capacitance value of the capacitor C2 will become large. Therefore, for example, as shown in FIG. 16, if applied as a=0.2, and frequencies b·fo, c·fo, and d·fo are optimized, X2/X1=−0.661 is satisfied at fo−10%, X2/X1=−0.662 is satisfied at fo, X2/X1=−0.661 is satisfied at fo+10%, and then X2/X1=−0.661 is neared at 20% of fractional band width, at the time of b=1.08, c=2.26 and d=2.70.

Figure 17:
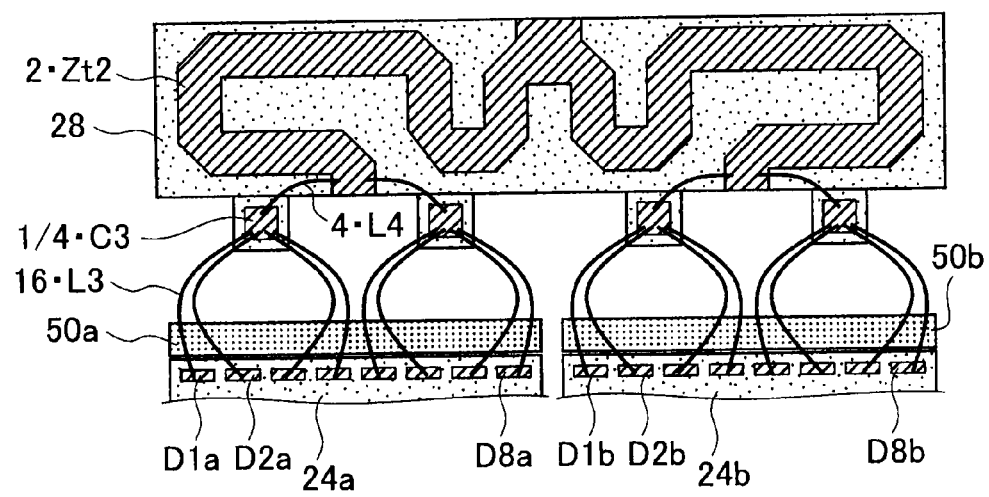
FIG. 17 is a schematic planar pattern configuration diagram showing one embodiment of an overview of the output side matching circuit, in the class-C power amplifier according to the embodiment.

A schematic planar pattern configuration diagram showing one embodiment of an overview of the output side matching circuit 104 in the class-C power amplifier according to the embodiment is expressed as shown in FIG. 17. Also, a schematic planar pattern configuration showing one embodiment of an overview of the lumped circuit for harmonic treatment unit 50 (50a, 50b) near the FET chip is expressed as shown in FIG. 18.

FIG. 17 shows one embodiment which performs power combining between two chips composed of the FETs 24a and 24b. In order to connect in parallel, characteristic impedance of one side of the distributed transmission line formed on the output side matching circuit substrate 28 is set to 2·Zt2 which is 2-fold as compared with Zt2.

In order to ensure uniform power matching and harmonic treatment for the fundamental wave, the capacitor C3 is divide into four pieces, each the four pieces is set to ¼·C3, and then the FET chip is divided into eight cells. The drain terminal electrodes of the FET 24a and 24b are divided into eight pieces, respectively, and are expressed with D1a, D2a, . . . , D8a, D1b, D2b, . . . , D8b, respectively. Then, since each of the drain terminal electrode is parallel connection, each inductor L4 is increased by 4-fold, and each inductor L3 is increased by 16-fold. Although each of the bonding wire is expressed as one piece in FIG. 17, each of the bonding wire may be increased to the required number by reviewing current capacity in actuality.

Figure 18:
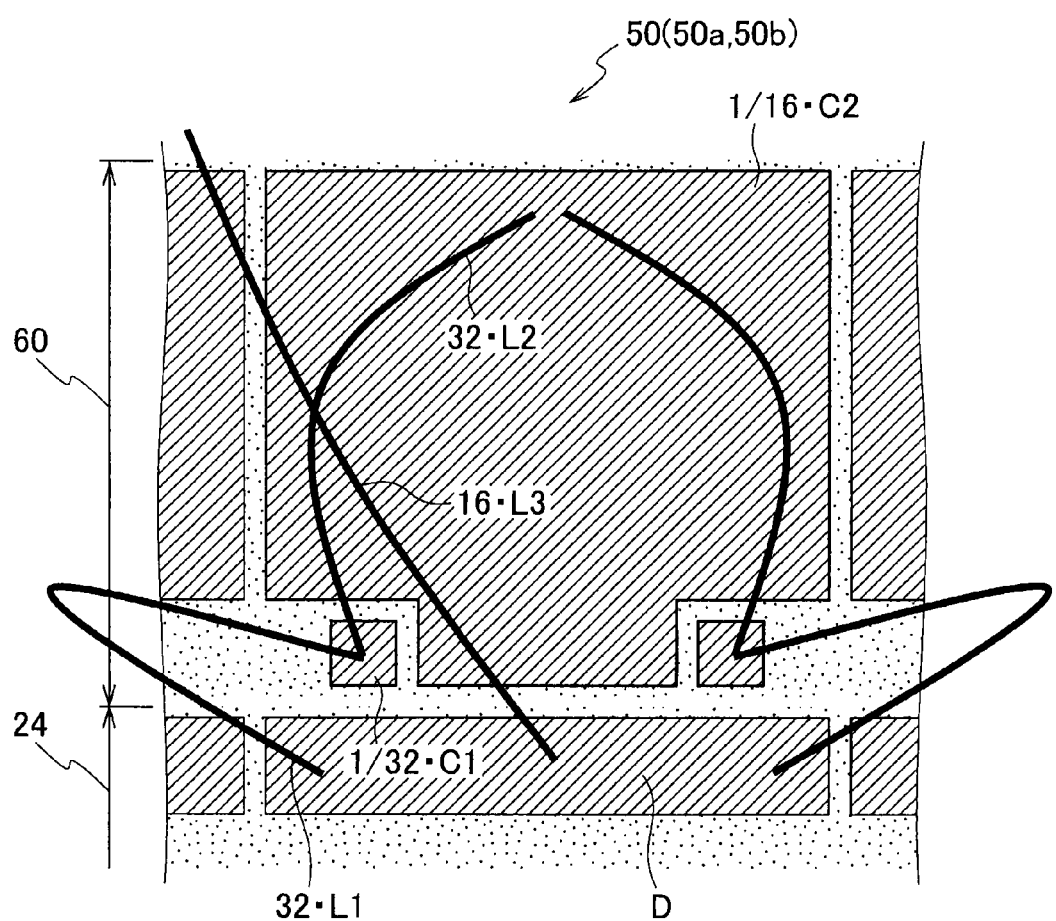
FIG. 18 is a schematic planar pattern configuration diagram showing one embodiment of an overview near an FET chip, in the class-C power amplifier according to the embodiment.

As shown in FIG. 18, a capacitor C1, a capacitor C2, an inductor L1, and an inductor L2 are disposed on the lumped circuit for harmonic treatment unit 50 (50a and 50b) omitted here. That is, in order to reduce mounting variation, the capacitor C1 and the capacitor C2 are built on the same capacitor substrate, and the capacitor C1 is divided into 32 pieces and the capacitor C2 is divided into 16 pieces. Stitch bonding is used in order to reduce the number of times of bonding of the small area capacitor C1 to one time. Therefore, in order that the bonding positions between the inductor L1 and the inductor L2 may be aligned in line, the bonding is performed in "reverse V"-shaped. Also, since the inductor L2 and the inductor L3 cross, bonding of the inductor L2 is formed lower than that of the inductor L3, and bonding of the inductor L3 is formed higher than that of the inductor L2.

On the other hand, in a Monolithic Microwave Integrated Circuit (MMIC) etc., since a multilayer structure is possible (and thereby a degree of flexibility in wire routing is high), and a capacitor can also be two stories high, it can achieve not only the configuration shown in FIG. 14 but also the configuration shown in FIG. 12 or FIG. 13 without any difficulty. In addition, even when parasitic inductances of VIA hole for grounding cannot be ignored, the parasitic inductance of two point of the grounding in FIG. 12 can be accommodated by design by treating with a part of the inductor L$ip$ or the inductor L2$p$. Also, the parasitic inductances of one point of the grounding in FIG. 13 can be accommodated by design by treating with a part of the inductor L1$s$. On the other hand, since the parasitic inductances of the grounding of the capacitor C1$l$ in FIG. 14 cannot be accommodated by design, a frequency characteristic becomes worse.

In addition, in MMIC etc., L and C of the lumped element may be used as a quasi-lumped element.

Also, when setting the conduction angle $\theta o/(2 \cdot \pi) = \frac{1}{8}$, the efficiency $\eta d = 98.5\%$ can be achieved and Lo will also further improve at −0.91 dB. However, since the maximum electric output power Po degrades by no less than 4.85 dB, it is not practical to decrease the conduction angle $\theta o$ any further.

As mentioned above, in the output side matching circuit 104, if the relationship between variables X1 and R1 is set to −R1<=X1<=R1, variable R1 is set to R1=Vdc/Imax·{1−cos($\theta o/2$)}/{$\theta o/2$−sin($\theta o$)/2}, and variable X2/X1 is set to X2/X1=−{$\theta o/2$−sin($\theta o$)/2}/{sin($\theta o/2$)−sin(1.5·$\theta o$)/3}, or each of the variables is set thereto so as to become equal substantially, the same efficiency rid and the same maximum electric output power Po as the class-C operation highly efficient than the class-B operation are achievable over the broader bandwidths.

In addition, although the embodiment has been described as the power amplifier for radar applications used at the maximum electric output power, a high degree of efficiency at the time of backoff is available by combining with Envelope Tracking (ET), an improvement of linearity is also available by combining with Digital Pre-Distortion (DPD), and thereby it can apply also to the use for the broadband communication.

According to the embodiment, in the class-C operation whose conduction angle θo is less than π(rad), the load impedance of the fundamental wave and the load impedance of the 2nd harmonic are applied as a function of θo, and thereby providing the class-C power amplifier having the high degree of efficiency over the broader bandwidths.

According to this embodiment, the class-C power amplifier which has the high degree of efficiency and can correspond to the broader bandwidths can be provided.

The Other Embodiments

While a certain embodiment has been described, the embodiment has been presented by way of examples only, and is not intended to limit the scope of the inventions. Indeed, the novel embodiment described herein may be embodied in a variety of other forms; furthermore, various omissions, substitutions and changes in the form of the embodiment described herein may be made without departing from the spirit of the inventions. The accompanying claims and their equivalents are intended to cover such forms or modifications as would fall within the scope and spirit of the inventions.

In addition, it needless to say that not only the FET but also a Bipolar Junction Transistor (BJT), a High Electron Mobility Transistor (HEMT), a Laterally Diffused Metal-Oxide-Semiconductor Field Effect Transistor (LDMOS), and a Heterojunction Bipolar Transistor (HBT), or a vacuum tube, etc. are applicable as an amplifying element mounted in the class-C power amplifier according to the embodiment described herein.

Such being the case, the present invention covers a variety of embodiments, whether described or not.

What is claimed is:

1. A class-C power amplifier comprising:
an amplifying element whose power supply voltage is expressed as Vdc and whose maximum current is expressed as Imax, a conduction angle θo of the amplifying element being less than π(rad), and load impedance of a fundamental wave being expressed as $Z1=R1+j \cdot X1$ and load impedance of a 2nd harmonic being expressed as $Z2=R2+j \cdot X2$ which are observed from a dependent current source of an equivalent circuit of the amplifying element, wherein
a relationship between variables X1 and R1 is set to $-R1 <= X1 <= R1$, variable R1 is set to $R1=Vdc/Imax \cdot \pi \cdot \{1-\cos(\theta o/2)\}/\{\theta o/2 - \sin(\theta o)/2\}$, and variable X2/X1 is set to $X2/X1 = -\{\theta o/2 - \sin(\theta o)/2\}/\{\sin(\theta o/2) - \sin(1.5 \cdot \theta o)/3\}$, or each of the variables is set thereto so as to become equal substantially, and
$R2 < 1/3 \cdot R1$ is applied.

2. The class-C power amplifier according to claim 1, wherein $\pi/4 < \theta o < \pi$ is applied.

3. The class-C power amplifier according to claim 1, wherein
an output side matching circuit is connected to the amplifying element, and the output side matching circuit comprising a distributed transmission line electrical circuit.

4. The class-C power amplifier according to claim 1, wherein
an output side matching circuit is connected to the amplifying element, and the output side matching circuit comprising a lumped circuit and a distributed transmission line electrical circuit.

5. The class-C power amplifier according to claim 1, wherein
an output side matching circuit is connected to the amplifying element, and the output side matching circuit comprising a lumped circuit for harmonic treatment and an impedance converting circuit.

6. The class-C power amplifier according to claim 5, wherein
the output side matching circuit comprises a reactance circuit composed of a parallel circuit of the lumped circuit for harmonic treatment and the output capacitance of the amplifying element.

7. The class-C power amplifier according to claim 6, wherein
the lumped circuit for harmonic treatment is a parallel circuit including a first series circuit composed of a first inductor and a first capacitor, and a second series circuit composed of a second inductor and a second capacitor.

8. The class-C power amplifier according to claim 6, wherein
the lumped circuit for harmonic treatment is a series circuit including a series circuit composed of a third inductor and a third capacitor, and a parallel circuit composed of a fourth inductor and a fourth capacitor.

9. The class-C power amplifier according to claim 6, wherein
the lumped circuit for harmonic treatment is a ladder type circuit composed of a fifth inductor connected in series, a fifth capacitor connected in parallel, a sixth inductor connected in series, and a sixth capacitor connected in parallel.

10. The class-C power amplifier according to claim 1, wherein
the amplifying element is one selected from the group consisting of a field effect transistor, a bipolar junction transistor, a high electron mobility transistor, a heterojunction bipolar transistor, and a vacuum tube.

* * * * *